(12) United States Patent
Lin

(10) Patent No.: US 8,143,930 B2
(45) Date of Patent: Mar. 27, 2012

(54) METHOD AND APPARATUS FOR AMPLIFYING A TIME DIFFERENCE

(75) Inventor: Chia-Liang Lin, Fremont, CA (US)

(73) Assignee: Realtek Semiconductor Corp., Taiwan (TW)

( * ) Notice: Subject to any disclaimer, the term of this patent is extended or adjusted under 35 U.S.C. 154(b) by 371 days.

(21) Appl. No.: 12/394,888

(22) Filed: Feb. 27, 2009

(65) Prior Publication Data

US 2009/0261878 A1 Oct. 22, 2009

Related U.S. Application Data

(60) Provisional application No. 61/046,454, filed on Apr. 21, 2008.

(51) Int. Cl.
*H03K 3/00* (2006.01)
(52) U.S. Cl. ........... 327/215; 327/217; 327/219; 326/94
(58) Field of Classification Search .................. 327/215, 327/217, 219; 326/94
See application file for complete search history.

(56) References Cited

U.S. PATENT DOCUMENTS

| | | | |
|---|---|---|---|
| 5,124,568 A * | 6/1992 | Chen et al. ..................... 327/217 |
| 6,094,082 A | 7/2000 | Gaudet | |
| 7,603,095 B2 | 10/2009 | Yang et al. | |
| 7,932,847 B1 * | 4/2011 | Hsieh et al. ................... 341/155 |
| 7,999,584 B2 | 8/2011 | Rhee et al. | |
| 2006/0184333 A1 | 8/2006 | Stern | |
| 2007/0268054 A1 | 11/2007 | Uemura et al. | |
| 2009/0267668 A1 | 10/2009 | Lin | |

FOREIGN PATENT DOCUMENTS

JP 1-304518 A 12/1989

OTHER PUBLICATIONS

"U.S. Appl. No. 12/394,846, Non Final Office Action mailed Sep. 19, 2011", 7 pgs.

* cited by examiner

*Primary Examiner* — Long Nguyen
(74) *Attorney, Agent, or Firm* — Schwegman, Lundberg & Woessner, P.A.

(57) ABSTRACT

Various methods and apparatus can be used for amplifying a time interval in a variety of applications. In an embodiment, a feedback device is implemented in a time amplifier in conjunction with an output device of the time amplifier.

19 Claims, 4 Drawing Sheets

METHOD AND APPARATUS FOR AMPLIFYING A TIME DIFFERENCE

RELATED APPLICATIONS

This application claims the benefit under 35 U.S.C. 119(e) of U.S. Provisional Patent Application Ser. No. 61/046,454 filed Apr. 21, 2008, which is incorporated herein by reference in its entirety. This application is related to U.S. patent application Ser. No. 12/394,846 filed on Feb. 27, 2009, which is incorporated by reference in its entirety.

FIELD OF TECHNOLOGY

This disclosure relates generally to methods and apparatus that include a time amplifier.

BACKGROUND

A time amplifier is an apparatus for amplifying a time difference between two electrical signals. The ratio between the output time difference and the input time difference is defined as the gain, or amplification factor, of the time amplifier. Some present time amplifiers use capacitors to achieve a high gain for the time amplifier. Using a contemporary CMOS (complementary metal-oxide semiconductor) integrated circuit for the time amplifier, the capacitors are comparatively large and usually dominate the total circuit area and power consumption when a high gain is sought.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In various embodiments, a time amplifier that utilizes an inverter feedback in its configuration to increase an amplification factor. Embodiments include apparatus and methods of amplifying a time difference incorporate a pair of feedback inverters at the output of a time amplifier to enhance the meta-stability of a SR latch of the time amplifier. A positive feedback loop incorporated at an output of a SR latch to enhance a meta-stability can be embodied in numerous alternative manners. Such methods and apparatus utilizing feedback according to the various embodiments can be practiced in other applications besides the particular application of time amplifier. Such other applications include whatever applications where an enhancement of meta-stability of a latch circuit is desirable.

In an embodiment, an apparatus includes a time amplifier circuit, where the time amplifier circuit comprises a SR latch adapted to receive a first and second input signal and to generate a first output signal and a second output signal, a first inverter for receiving the first output signal and generating a first intermediate signal, a second inverter for receiving the second output signal and generating a second intermediate signal, a third inverter coupled to the first output signal, and a fourth inverter coupled to the second output signal, wherein the first output signal is coupled to a power input for the second inverter and the second output signal is coupled to a power input for the first inverter.

In an embodiment a method is provided for modifying a meta-stability of a SR latch circuit, where the method comprises coupling an input of a first inverter to a first output of the SR latch and a power input of a second inverter, the first inverter adapted to receive a first output signal from the SR latch and to generate a first intermediate signal, coupling an input of the second inverter to a second output of the SR latch and a power input of the first inverter, the second inverter adapted to receive a second signal from the SR latch and to generate a second intermediate signal, coupling a third inverter to the first output of the SR latch to form a first feedback loop, and coupling a fourth inverter to the second output of the SR latch to form a second feedback loop.

Figure 1:
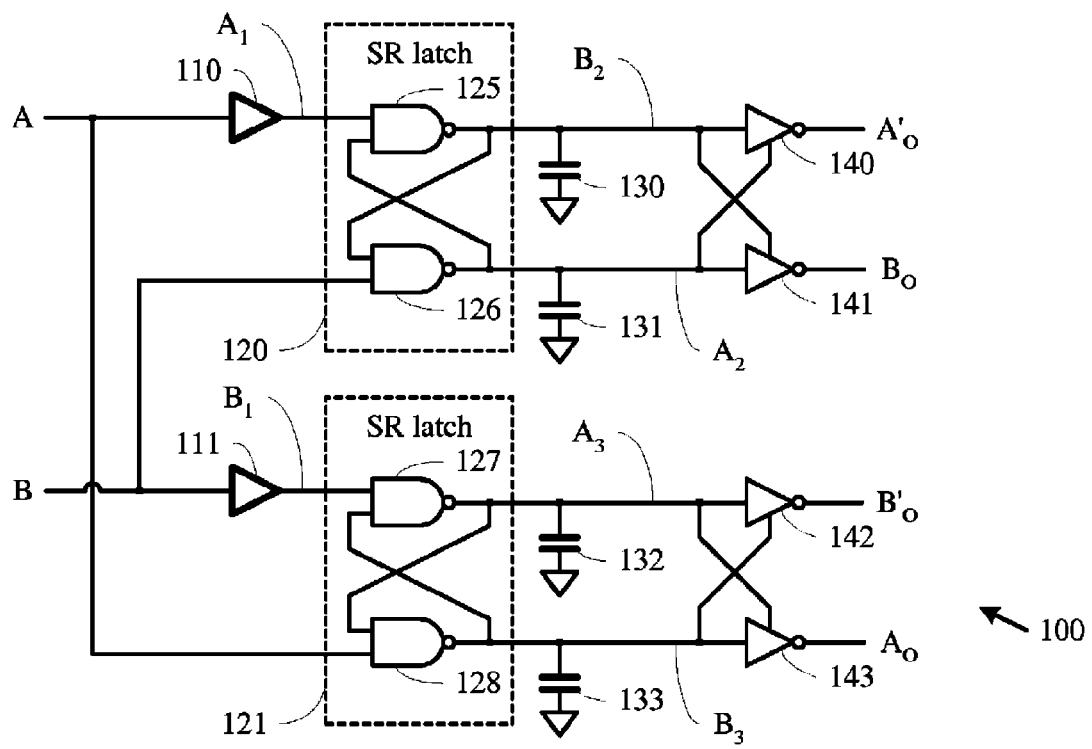
FIG. 1 shows an example of a time amplifier.

FIG. 1 shows an example of a time amplifier circuit. The time amplifier 100 includes a first buffer 110, a second buffer 111, a first SR latch 120, a second SR latch 121, a first inverter pair 140 and 141, and a second inverter pair 142 and 143. First buffer 110 is arranged for receiving a first input signal A and generating an intermediate signal $A_1$, which is a delayed version of A. Second buffer 111 is arranged for receiving a second input signal B and for generating an intermediate signal $B_1$, which is a delayed version of B. First SR latch 120 comprises a first pair of cross-coupled NAND gates 125-126 for receiving $A_1$ and B and for generating intermediate signals $B_2$ and $A_2$ and a first pair of capacitors 130-131 provided as a load at the output of the first SR latch 120. Second SR latch 121 comprises a second pair of cross-coupled NAND gates 127-128 for receiving $B_1$ and A and for generating intermediate signals $A_3$ and $B_3$ and a second pair of capacitors 132-133 provided as a load at the output of the second SR latch 121. First inverter pair 140 and 141 is configured for receiving $B_2$ and $A_2$ and for generating output signals $A'_O$ and $B_O$, respectively, where the input to inverter 140 is provided as the power supply for inverter 141 and vice versa. Second inverter pair 142 and 143 is configured for receiving $A_3$ and $B_3$ and for generating output signals $B'_O$ and $A_O$, where the input to inverter 142 is provided as the power supply for inverter 143 and vice versa.

Figure 2:
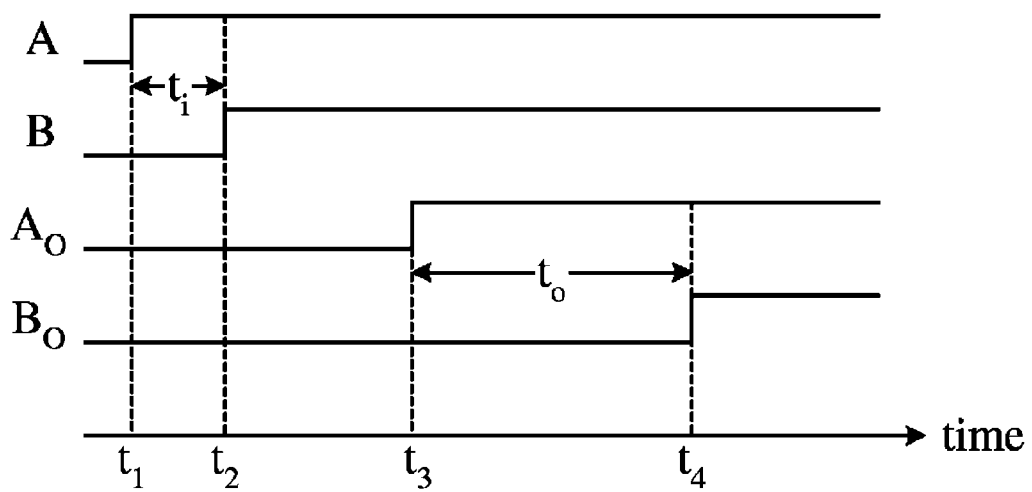
FIG. 2 shows a typical timing diagram for the time amplifier of FIG. 1.

FIG. 2 depicts a timing diagram for the time amplifier 100 of FIG. 1. Here, the first input signals A is a logical signal making a transition from a first logical value (0 or LOW) to a second logical value (1 or HIGH) at time instant $t_1$, and the second input signal B is also a logical signal making a transition from the first logical value (0 or LOW) to the second logical value (1 or HIGH) at time instant $t_2$, where $t_2-t_1=t_i$. Output signal $A_O$ is a logical signal making a transition from the first logical value (0 or LOW) to the second logical value (1 or HIGH) at time instant $t_3$, and output signal $B_O$ is also a logical signal making a transition from the first logical value (0 or LOW) to the second logical value (1 or HIGH) at time instant $t_4$, where $t_4-t_3=t_o$. Time amplifier 100 works in a manner so that $t_o>t_i$, thus generating an output time difference greater than an input time difference. Using a contemporary CMOS integrated circuit for the time amplifier 100, the capacitors 130-133 are comparatively large and usually dominate the total circuit area and power consumption when a high gain is sought.

FIG. 3A shows a time amplifier circuit 300 in accordance with various embodiments of the invention. The time amplifier 300 includes a first buffer 310, a second buffer 311, a first SR latch 320, a second SR latch 321, a first inverter pair 340, 341, a second inverter pair 342, 343, and four feedback inverters 346, 347, 348, 349. The first buffer 310 receives a first input signal X and generates an intermediate signal $X_1$, which is a delayed version of X. The second buffer 311 receives a second input signal Y and generates an intermediate signal $Y_1$, which is a delayed version of Y. The first SR latch 320 includes a first pair of cross-coupled NAND gates 325-326 for receiving $X_1$ and Y and for generating intermediate signals $Y_2$ and $X_2$. The second SR latch 321 includes a second pair of cross-coupled NAND gates 327-328 for receiving $Y_1$ and X and for generating intermediate signals $X_3$ and $Y_3$. The first inverter pair 340-341 receives $Y_2$ and $X_2$, respectively, and generates output signals $X'_O$ and $Y_O$, respectively, where the input to inverter 340 is provided as the power supply for inverter 341 and vice versa. The second inverter pair 342-343 receives $X_3$ and $Y_3$, respectively, and generates output signals $Y'_O$ and $X_O$, respectively, where the input to inverter 342 is provided as the power supply for inverter 343 and vice versa. The first feedback inverter 346 receives $X'_O$ and provides positive feedback to $Y_2$. The second feedback inverter 347 receives $Y_O$ and provides positive feedback to $X_2$. The third feedback inverter 348 receives $Y'_O$ and provides positive feedback to $X_3$. The fourth feedback inverter 349 receives $X_O$ and provides positive feedback to $Y_3$.

Figure 3:
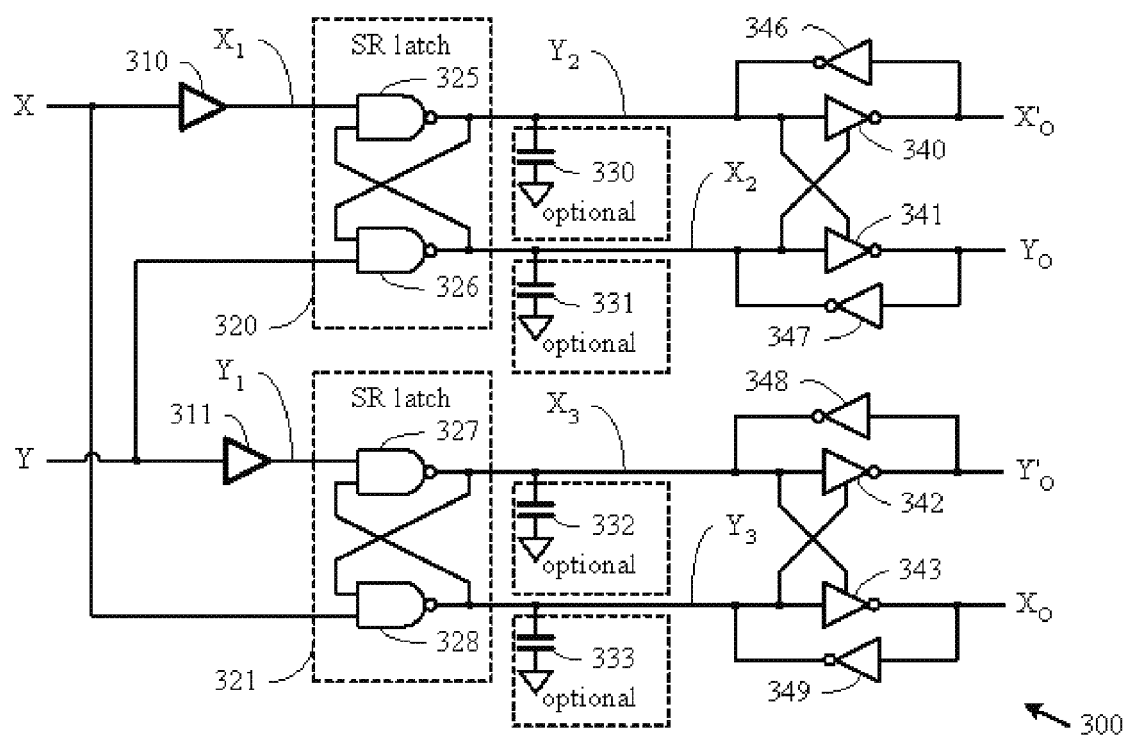
FIG. 3 shows a time amplifier in accordance with various embodiments of the invention.

As depicted in FIG. 3, time amplifier 300 comprises an upper circuit, including buffer 310, SR latch 320, inverters 340-341, and inverters 346-347, and a lower circuit, including buffer 311, SR latch 321, inverters 342-343, and inverters 348-349, of exactly the same circuit topology. In various embodiments, the upper circuit is substantially identical to the lower circuit. However, embodiments are not limited to configurations in which an upper circuit of a time amplifier circuit is substantially identical to a lower circuit to the time amplifier circuit.

In various embodiments, one or more optional capacitors are connected to the output of the first and second SR latches 320, 321 as a means to further increase the gain of the time amplifier 300. In an embodiment, a first pair of capacitors 330, 331 are incorporated as a load at the output of the first SR latch 320, and a second pair of capacitors 332, 333 are incorporated as a load at the output of the second SR latch 321. Capacitors 330-333 are optional, and do not need to be large when incorporated.

When both input signals X and Y are making a transition from a first logical value (0 or LOW) to a second logical value (1 or HIGH) at two slightly different time instants, respectively, a phenomenon known as meta-stability occurs in both SR latches 320 and 321. Meta-stability causes a SR latch to act slowly in making a logical transition at its output. A more pronounced meta-stability in a SR latch causes a more prolonged delay in an output transition. The prolonged delay provides a higher amplification factor for the time difference between the transitions of the first and second signals. Conventional time amplifiers use relatively large capacitors at outputs of SR latches to enhance meta-stability and thus increase amplification factor for a time difference. Use of relatively large capacitors at outputs of SR latches tends to be an inefficient use of area on a chip and inefficient with respect to power consumption. In contrast, time amplifier 300 of FIG. 3 relies on an alternative method to enhance a meta-stability for SR latches 320 and 321.

When SR latch 320 attempts to make a transition from logical 1 (HIGH) to logical 0 (LOW) for intermediate signal $Y_2$, which is the first output of SR latch 320, it faces a resistance from inverter 346. Inverters 340 and 346 form a positive feedback loop that inclines to hold on to the current state of the SR Latch output and thus impedes the transition. Additionally, when SR latch 320 attempts to make a transition from logical 1 (HIGH) to logical 0 (LOW) for intermediate signal $X_2$, which is the second output of SR latch 320, it faces resistance from inverter 347 as inverters 341 and 347 form a positive feedback loop that inclines to hold on to the current state of $X_2$ and thus impedes the transition. In this manner, the first and second inverters 346 and 347 impede a state transition and thus enhance the meta-stability of the first SR latch 320. The third and forth inverters 348 and 349 impede a state transition of the second SR latch outputs $X_3$ and $Y_3$ and thus enhance the meta-stability of the second SR latch 321. The four feedback inverters effectively increase the amplification gain of the time amplifier 300. However, four feedback inverters 346, 347, 348, 349 are configured to ensure that the strengths, or driving capabilities, of the four feedback inverters 346, 347, 348, 349 are not greater than those of the NAND gates 325, 326, 327, and 328, otherwise, the resistance to making a transition may be too great such that SR latch 320, 321 may never make a state transition.

In the illustrated example of FIG. 3, the time amplifier 300 includes a first and second input buffer 310, 311. Buffer 310 introduces an imbalance in timing delay between the path from X to $X'_O$ and the path from Y to $Y_O$. Buffer 311 introduces an imbalance in timing delay between the path from Y to $Y'_O$ and the path from X to $X_O$. It is understood that is possible to use other circuits to introduce an imbalance in timing delay to the signal paths in various embodiments. For example, in an alternative embodiment (not shown), the time amplifier does not include first and second input buffers 310, 311 and input X and Y signals are directly connected to SR latches 320 and 321, respectively. An imbalance is introduced between signal path of the SR latches 320, 321 by selecting an SR latch with NAND gates having different driving capabilities such as a NAND gate 326 (328) having a greater driving capability than NAND gate 325 (327). In another example, an imbalance is introduced between signal paths through one or both SR latches by connecting the optional capacitors to the outputs of one or both SR latches such that the capacitance, such as 330 (332), connected to one output of a SR latch is different from the capacitance, such as 331 (333), connected to the other output of the SR latch.

Figure 4:
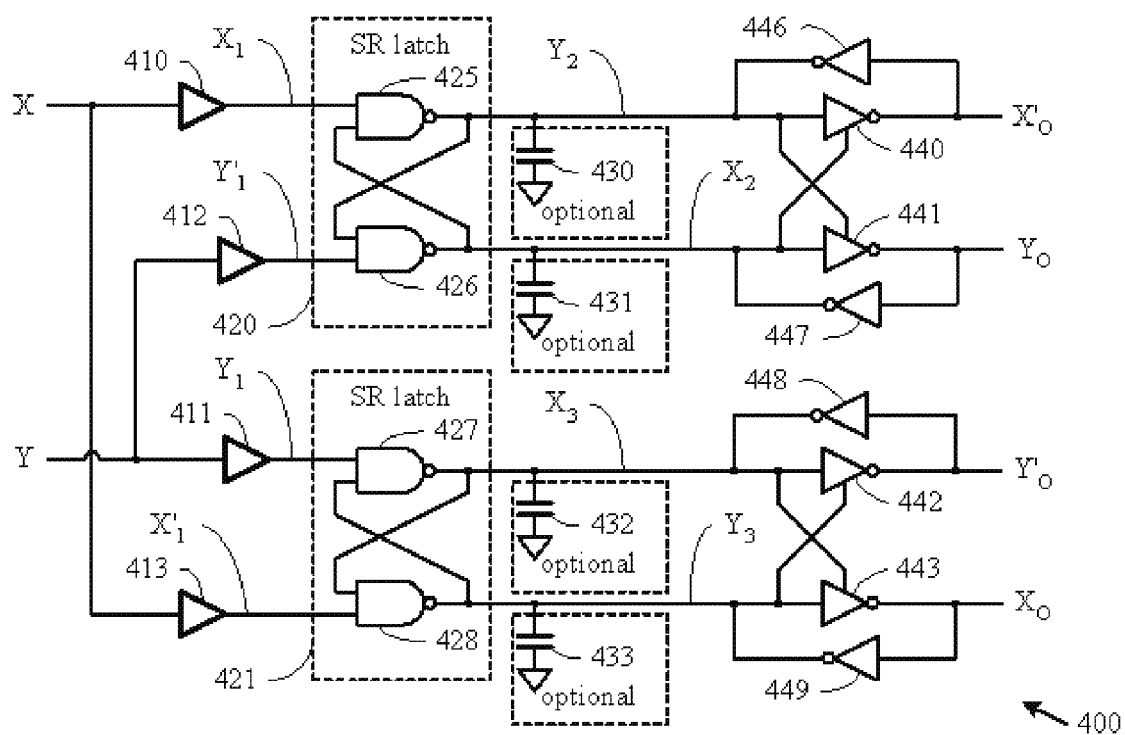
FIG. 4 shows a time amplifier of an alternative embodiment in accordance with the invention.

FIG. 4 shows a time amplifier according to an embodiment of the invention. The time amplifier 400 includes a first buffer 410, a second buffer 412, a third buffer 411, a fourth buffer 413, a first SR latch 420, a second SR latch 421, a first inverter pair 440, 441, a second inverter pair 442, 443, and four feedback inverters 446, 447, 448, 449. The first buffer 410 receives a first input signal X and generates an intermediate signal $X_1$, which is a delayed version of X. The second buffer 412 receives a second input signal Y and generates an intermediate signal $Y'_1$, which is a delayed version of Y. The third buffer 411 receives second input signal Y and generates an intermediate signal $Y_1$, which is another delayed version of Y. The fourth buffer 413 receives first input signal X and generates an intermediate signal $X'_1$, which is another delayed version of X. The first SR latch 420 includes a first pair of cross-coupled NAND gates 425 and 426 for receiving $X_1$ and $Y'_1$ and for generating intermediate signals $Y_2$ and $X_2$. The second SR latch 421 includes a second pair of cross-coupled NAND gates 427 and 428 for receiving $Y_1$ and $X'_1$ and for generating intermediate signals $X_3$ and $Y_3$. The first inverter pair 440 and 441 receives $Y_2$ and $X_2$, respectively, and generates output signals $X'_O$ and $Y_O$, respectively, where the input to inverter 440 is provided as the power supply for inverter 441 and vice versa. The second inverter pair 442-443 receives $X_3$ and $Y_3$, respectively, and generates output signals $Y'_O$ and $X_O$, respectively, where the input to inverter 442 is provided as the power supply for inverter 443 and vice versa. The first feedback inverter 446 receives $X'_O$ and provides positive feedback to $Y_2$. The second feedback inverter 447 receives $Y_O$ and provides positive feedback to $X_2$. The third feedback inverter 448 receives $Y'_O$ and provides positive feedback to $X_3$. The fourth feedback inverter 449 receives $X_O$ and provides positive feedback to $Y_3$.

An imbalance is introduced between the signal paths through each of the SR latches 420, 421 using input buffers 410, 411, 412, 413. First buffer 410 and Second buffer 412 are selected such that they have different delays to create an imbalance in the timing delay for the signal paths from X to $X'_O$ and from Y to $Y_O$ through SR latch 420. Third buffer 411 and fourth buffer 413 are selected such that they have different delays to create an imbalance in the timing delay for the signal paths from Y to $Y'_O$ and from X to $X_O$ through SR latch 421.

In various embodiments, one or more optional capacitors are connected to the output of the first and second SR latches 420, 421 as a means to further increase the gain of the time amplifier 400. In an embodiment, a first pair of capacitors 430, 431 are incorporated as a load at the output of the first latch 420, and a second pair of capacitors 432, 433 are incorporated as a load at the output of the second latch 421.

In some example embodiments, a pair of cross-coupled NOR gates can be used to embody a SR latches. In such example embodiments, the time amplifier amplifies a time difference between two signals making a transition from logical 1 (HIGH) to logical 0 (LOW). Introducing an inverter to each of the input signals allows the time amplifier to amplify a time difference between two signals making a transition from logical 0 (LOW) to logical 1 (HIGH). It is understood that other inversion schemes can be implemented to convert the amplifier circuits between transitions from LOW to HIGH and vice versa according to various embodiments. Such circuits, realized as logic circuits that provide a functional inversion, include, but are not limited to, a NAND gate with one of its two inputs being tied to logical 1 (HIGH), or a NOR gate with one of its two inputs being tied to logical 0 (LOW).

Figure 5:
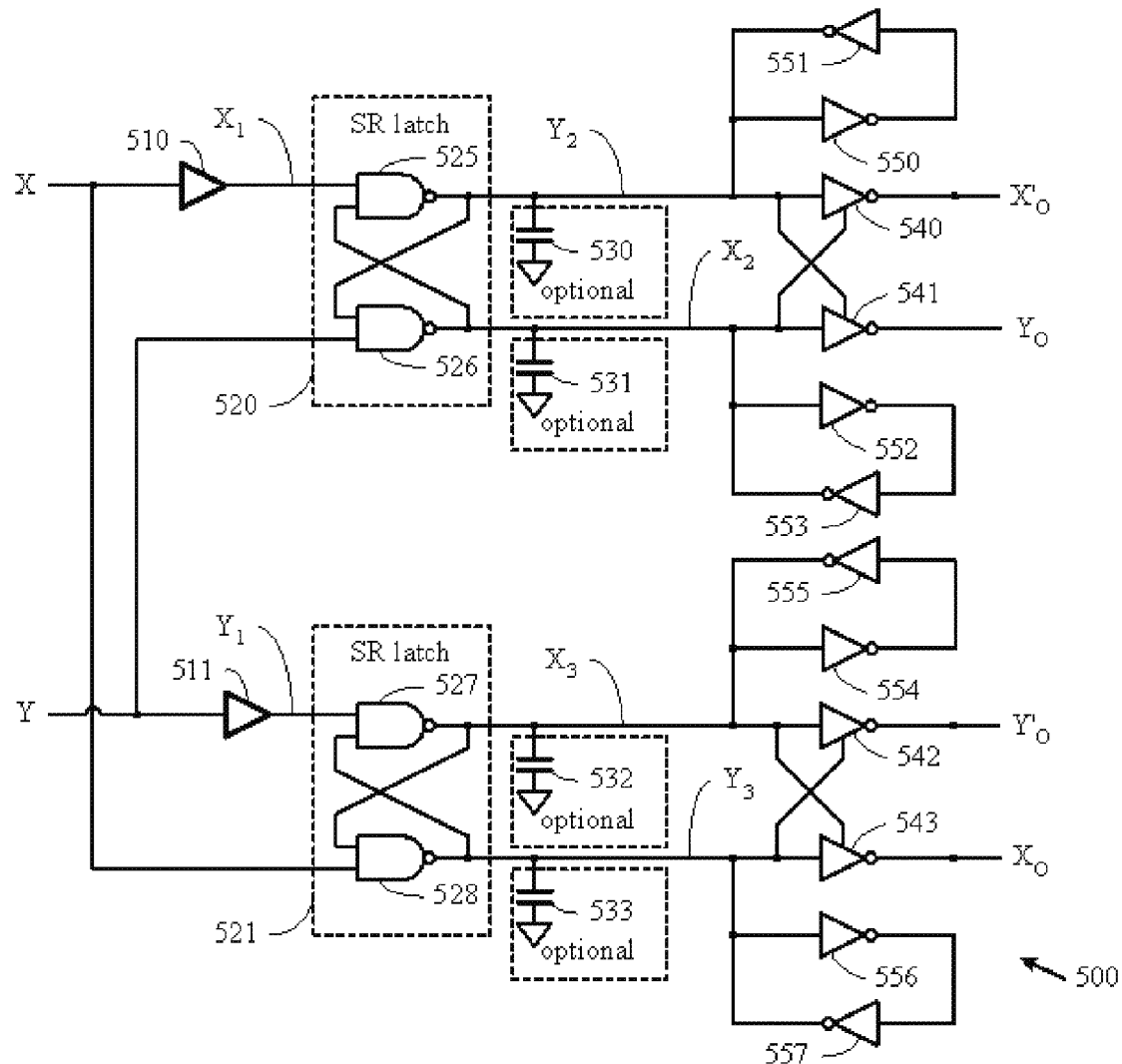
FIG. 5 shows a time amplifier of another alternative embodiment in accordance with the invention.

FIG. 5 shows a time amplifier 500 according to an embodiment of the invention. The time amplifier 500 includes a first buffer 510, a second buffer 511, a first SR latch 520, a second SR latch 521, a first inverter pair 540, 541, a second inverter pair 542, 543, and eight delay inverters 550-557. The first buffer 510 receives a first input signal X and generates an intermediate signal $X_1$, which is a delayed version of X. The second buffer 511 receives a second input signal Y and generates an intermediate signal $Y_1$, which is a delayed version of Y. The first SR latch 520 includes a first pair of cross-coupled NAND gates 525, 526 for receiving $X_1$ and Y and for generating intermediate signals $Y_2$ and $X_2$. The second SR latch 521 includes a second pair of cross-coupled NAND gates 527, 528 for receiving $Y_1$ and X and for generating intermediate signals $X_3$ and $Y_3$. The first inverter pair 540 and 541 receives $Y_2$ and $X_2$, respectively, and generates output signals $X'_O$ and $Y_O$, respectively, where the input to inverter 540 is provided as the power supply for inverter 541 and vice versa. The second inverter pair 542 and 543 receives $X_3$ and $Y_3$, respectively, and generates output signals $Y'_O$ and $X_O$, respectively, where the input to inverter 542 is provided as the power supply for inverter 543 and vice versa.

In the illustrated example of FIG. 5, buffer 510 introduces an imbalance in timing delay between the path from X to $X'_O$ and the path from Y to $Y_O$. Buffer 511 introduces an imbalance in timing delay between the path from Y to $Y'_O$ and the path from X to $X_O$. It is understood that other configurations can be realized to introduce an imbalance in timing delay to the signal paths in many ways according to various embodiments.

The time amplifier 500 uses a delay loop to provide positive feedback to the output inverter pairs. A first delay inverter 550 and a second delay inverter 551 provide positive feedback of $Y_2$ to the first output inverter 540. A third delay inverter 552 and a fourth delay inverter 553 provide positive feedback of $X_2$ to the second output inverter 541. A fifth delay inverter 554 and a sixth delay inverter 555 provide positive feedback of $X_3$ to the third output inverter 542. A seventh delay inverter 556 and an eighth delay inverter 557 provide positive feedback of $Y_3$ to the fourth output inverter 543. It is understood that other positive feedback schemes can be realized for the time amplifier according to various embodiments.

In various embodiments, one or more optional capacitors are connected to the output of the first and second SR latches 520, 521 as a means to further increase the gain of the time amplifier 500. In one embodiment, a first pair of capacitors 530, 531 are incorporated as a load at the output of the first latch 520, and a second pair of capacitors 532, 533 are incorporated as a load at the output of the second latch 521.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
   a time amplifier circuit including
     a first output device;
     a first feedback device, the first feedback device coupled to an input of the first output device, the first feedback device configured to provide a positive feedback to the input of the first output device;
     an SR latch configured to receive a first input signal and a second input signal and to generate a first intermediate output signal and a second intermediate output signal, wherein the first output device is configured to receive the first intermediate output signal and generate a first output signal;
     a second output device configured to receive the second intermediate output signal and generate a second output signal;
     the first feedback device coupled to the input of the first output device to form a first positive feedback loop; and
     a second feedback device coupled to an input of the second output device to form a second positive feedback loop.

2. The circuit of claim 1, wherein each of the first output device and the second output device comprises an inverter.

3. The circuit of claim 2, wherein each of the first feedback device and the second feedback device comprises an inverter.

4. The circuit of claim 1, wherein the SR latch comprises two cross-coupled NAND gates.

5. The circuit of claim 1, wherein the SR latch comprises two cross-coupled NOR gates.

6. The circuit of claim 1, further comprising a first capacitor coupled to receive the intermediate first output signal to enhance a meta-stability of the SR latch.

7. The circuit of claim 1, further comprising a buffer coupled to the SR latch and configured to generate the first input signal.

8. The circuit of claim 1, further comprising a buffer coupled to the SR latch and configured to generate the second input signal.

9. A time amplifier comprising:
a first meta-stable circuit and a second meta-stable circuit, each meta-stable circuit comprising:
an SR latch configured to receive a first and second input signal and to generate a first intermediate signal and a second intermediate signal;
a first output device configured to receive the first intermediate signal and to generate a first output signal;
a second output device configured to receive the second intermediate signal and to generate a second output signal;
a first feedback device coupled to the first output device to form a first positive feedback loop; and
a second feedback device coupled to the second output device to form a second positive feedback loop.

10. The time amplifier of claim 9, wherein an input of the first feedback device is coupled to an output of the first output device to form the first positive feedback loop.

11. The time amplifier of claim 9, wherein an input of the second feedback device is coupled to an output of the second output device to form the second positive feedback loop.

12. The time amplifier of claim 9, wherein at least one of the first output device and the second output device comprises an inverter.

13. The time amplifier of claim 9, wherein at least one of the first feedback device and the second feedback device comprises an inverter.

14. The time amplifier of claim 9, further comprising a first capacitor coupled to receive the first intermediate signal to enhance a meta-stability of the SR latch.

15. A method of enhancing a meta-stability of an SR latch, the method comprising:
coupling an input of a first output device to a first output of the SR latch;
coupling an input of a second output device to a second output of the SR latch;
coupling an output of a first feedback device to the first output of the SR latch to form a first positive feedback loop; and
coupling an output of a second feedback device to the second output of the SR latch to form a second positive feedback loop.

16. The method of claim 15, wherein each of the first output device and the second output device comprises an inverter.

17. The method of claim 16, wherein each of the first feedback device and the second output device comprises an inverter.

18. The method of claim 15, wherein an input of the first feedback device is coupled to an output of the first output device and an input of the second feedback device is coupled to an output of the second output device.

19. The method of claim 15, wherein each of the first positive feedback loop and the second positive feedback loop comprises two inverters cascaded in a ring configuration.

* * * * *